United States Patent [19]
Ellis et al.

[11] Patent Number: 5,171,650
[45] Date of Patent: Dec. 15, 1992

[54] ABLATION-TRANSFER IMAGING/RECORDING

[75] Inventors: Ernest W. Ellis, Leverett; Diane M. Foley; Dana R. Arnold, both of Northampton, all of Mass.

[73] Assignee: Graphics Technology International, Inc., South Hadley, Mass.

[21] Appl. No.: 707,039

[22] Filed: May 29, 1991

Related U.S. Application Data

[63] Continuation-in-part of Ser. No. 592,790, Oct. 4, 1990, abandoned.

[51] Int. Cl.⁵ .................................................. G03C 5/54
[52] U.S. Cl. ........................................ 430/20; 430/201; 430/271; 430/273; 430/275; 430/278; 430/945; 430/964
[58] Field of Search ............... 430/201, 271, 273, 275, 430/278, 945, 964, 20; 346/135.1

[56] References Cited

U.S. PATENT DOCUMENTS

| | | | |
|---|---|---|---|
| 3,787,210 | 1/1974 | Roberts | 430/201 |
| 3,962,513 | 6/1976 | Eames | 430/201 |
| 4,230,939 | 10/1980 | DeBont et al. | 430/945 |
| 4,245,003 | 1/1981 | Oransky et al. | 430/201 |
| 4,396,701 | 8/1983 | Bouldin | 430/271 |
| 4,412,231 | 10/1983 | Namba et al. | 430/964 |
| 4,465,767 | 8/1984 | Oba et al. | 430/271 |
| 4,588,674 | 5/1986 | Stewart et al. | 430/201 |
| 4,639,745 | 1/1987 | Matsui et al. | 430/945 |
| 4,656,121 | 4/1987 | Sato et al. | 430/271 |
| 4,702,958 | 10/1987 | Itoh et al. | 430/201 |
| 4,711,834 | 12/1987 | Butters et al. | 430/201 |
| 4,920,359 | 4/1990 | Arai et al. | 430/495 |
| 4,948,778 | 8/1990 | DeBoer | 430/201 |
| 4,950,640 | 8/1990 | Evans et al. | 430/201 |

*Primary Examiner*—Richard L. Schilling
*Attorney, Agent, or Firm*—Burns, Doane, Swecker & Mathis

[57] ABSTRACT

A unique method/system for simultaneously creating and transferring a contrasting pattern of intelligence on and from a composite ablation-transfer imaging medium to a receptor element in contiguous registration therewith is improvedly radiation sensitive and versatile, is kinetically rapid and not dependent on a sensitized ablative topcoat, and is well adopted for such applications as, e.g., color proofing and printing, the security coding of various documents and the production of masks for the graphic arts and printed circuit industries; the composite ablation-transfer imaging medium, per se, comprises a support substrate (i), at least one intermediate "dynamic release layer" (ii) essentially coextensive therewith and an imaging radiation-ablative carrier topcoat (iii) also essentially coextensive therewith, said imaging radiation-ablative carrier topcoat (iii) including an imaging amount of a constrast imaging material contained therein, and said at least one dynamic release layer (ii) absorbing such imaging radiation at a rate sufficient to effect the imagewise ablation mass transfer of at least said carrier topcoat (iii).

45 Claims, 4 Drawing Sheets

ABLATION-TRANSFER IMAGING/RECORDING

CROSS-REFERENCE TO RELATED APPLICATIONS

This application is a continuation-in-part of our copending application Ser. No. 07/592,790, filed Oct. 4, 1990, now abandoned. Foley et al copending application Ser. No. 07/706,775, pending filed concurrently herewith, and a continuation-in-part of copending application Ser. No. 07/497,648, filed Mar. 23, 1990 now abandoned, itself a continuation-in-part of Ser. No. 07/330,497, filed Mar. 30, 1989 and now abandoned; each is assigned to the assignee hereof.

BACKGROUND OF THE INVENTION

1. Field of the Invention

The present invention relates to improved composite ablation-transfer imaging media comprising a support substrate, at least one intermediate "dynamic release layer" essentially coextensive therewith and an imaging radiation-ablative carrier topcoat also essentially coextensive therewith; the at least one dynamic release layer absorbs such imaging radiation and promotes/enhances the ablative-transfer of at least the imaging radiation-ablative carrier topcoat to a receptor element and the carrier topcoat includes an imaging amount of a contrast imaging material contained therein.

This invention also relates to method/system for simultaneously creating and transferring a contrasting pattern of intelligence on and from such composite ablation-transfer imaging media to a receptor element in contiguous registration therewith, whereby said imaging material delineates said pattern of intelligence thereon. The pattern of intelligence transferred to the receptor element is thus of opposite sign of that simultaneously created on the imaging medium.

The present invention especially relates to photo-induced ablation-transfer imaging/recording and, preferably, to laser-induced ablation-transfer imaging/recording particularly adopted for such applications as color printing/proofing and masking.

2. Description of the Prior Art

The phenomenon of, e.g., laser-induced ablation-transfer imaging, is generically known to this art and is believed to entail both complex non-equilibrium physical and chemical mechanisms. Indeed, such laser-induced ablation-transfer is thought to be effected by the rapid and transient accumulation of pressure beneath and/or within a mass transfer layer initiated by imagewise irradiation. Transient pressure accumulation can be attributed to one or more of the following factors: rapid gas formation via chemical decomposition and/or rapid heating of trapped gases, evaporation, photo and thermal expansion, ionization and/or by propagation of a shockwave. The force produced by the release of such pressure is sufficient to cause transfer of the imaging layer to an adjacent receptor element. The force is preferably sufficient to effect the complete transfer of the exposed area of an entire layer rather than the partial or selective transfer of components thereof.

Other material transfer imaging/recording techniques based on equilibrium physical changes in the material are also known to this art, but are severely limited in terms of both the overall speed of the process as well as in the materials which can be employed therefor. In particular, ablation transfer differs from the known material transfer techniques such as, for example, thermal melt transfer and dye sublimation/dye diffusion thermal transfer (D2T2). Each of these prior art techniques typically employs thermal print heads as the source of imaging energy.

Alternatively, it is known to employ laser heating in lieu of the thermal printing head. In these systems, the donor sheet includes a material which strongly absorbs at the wavelength of the laser emission. In the thermal melt transfer process, when the donor sheet is irradiated, this absorbing material converts the laser light to thermal energy and transfers the heat to a colorant transfer layer which also includes a binder, fusible compound, etc., thereby raising its temperature above its melting point to effect its transfer onto an adjacent receptor sheet. In the D2T2 process, only the colorant is transferred to a specially treated or special receptor sheet (e.g., coated or porous) by sublimation or thermal diffusion. See, for example, JP 62/140,884, UK Patent Application GB 2,083,726 and U.S. Pat. Nos. 4,804,975, 4,804,977, 4,876,235, 4,753,923 and 4,912,083.

Compare also U.S. Pat. No. 3,745,586 relating to the use of laser energy to selectively irradiate the uncoated surface of a thin film, coated on one side with a contrast imaging absorber, to vaporize and to cause the selective transfer of the absorber coating to an adjacently spaced receptor, and U.S. Pat. No. 3,978,247 relating to sublimation transfer recording via laser energy (laser addressed D2T2), wherein the contrast imaging material is also the absorber.

Too, see published Japanese Application No. 62/140,884 describing a laser recording device, the focus of which is a composite transfer sheet including a base layer of plastic film, a middle layer containing substances that absorb laser light and convert it to heat and a transfer layer topcoat, the primary component of which is a colorant, as well as a receiver sheet to which images are transferred under the influence of the laser. The colorant transfer layer and/or top receiver sheet layer necessarily includes a heat-fusible phenolic, naphtholic, aromatic carboxylic acid or fatty acid amide compound. The plastic film base layer is thus coated with a substance that absorbs laser light and converts it to heat and is not transferred. This heat melts and transfers the image from the transfer layer to the receiver sheet and is said to provide a high-resolution and high-density image thereon.

Other transfer-imaging systems are described in U.S. Pat. Nos. 4,123,578, 4,157,412, 4,554,238, 4,847,237 and 4,897,310.

Nonetheless, these processes are limited in a variety of significant respects. For example, in melt transfer, the composition must contain low melting materials to transfer a pigment or dye and receptor sheets appropriately textured for wicking or having special coatings are required for best results. In D2T2, only the imaging dye itself is transferred; thus, it becomes necessary to employ special receptor sheets in order to effectively bind and stabilize ("trap") the dye. Compare, for example, U.S. Pat. No. 4,914,078 to Hann et al. Furthermore, additional post-heating treatment steps, such as the "setting" of the dyes in the binder which is present on the receptor sheet increases both the complexity and the time associated with the process. Such process is also limited to those dyes and pigments which undergo sublimation or diffusion in response to the particular imaging stimulus.

These processes are further limited in that the relatively slow processes of heat diffusion and thermal equilibrium are involved.

Accordingly, need exists in this art for a transfer process which is far more rapid than current transfer techniques, which can effectively employ a wide variety of functional materials and which is not limited to specially treated or special receptor elements.

Laser-induced recording based on the removal or displacement of material from the exposed area is also known to the recording art. However, these applications do not require transfer of the material from one substrate to another. Historically, laser-induced recording has been used, for example, in optical disk writing with near infrared (IR) lasers typically emitting at wavelengths ranging from 760 nm to 850 nm employed as the writing source. Since polymeric binders are typically non-absorbent in the near infrared region (760 nm to 2500 nm), infrared absorbers, i.e., sensitizers, are added to the substrate to absorb the laser radiation. This arrangement allows the laser radiation absorbed by the sensitizer to be converted to heat which causes pit formation. See, for example, U.S. Pat. Nos. 4,415,621, 4,446,233, 4,582,776 and 4,809,022 and N. Shimadzu et al, *The Journal of Imaging Technology*, Vol. 15, No. 1, pg. 19 (1989). However, because this technology does not entail the imagewise transfer of materials from one substrate to another, these systems will not be further discussed.

There also exist in the recording art instances of laser-induced ablative transfer imaging entailing the displacement of material from a donor medium and adherently transferring same to an adjacent receptor element. These are limited to the use of large amounts of a black body absorber such as graphite or carbon black in conjunction with a Nd:YAG laser emitting at 1064 nm to transfer a black image. See, for example, U.S. Pat. Nos. 4,245,003, 4,702,958 and 4,711,834 (graphite sensitizer/absorber), U.S. Pat. No. 4,588,674 (carbon black sensitizer/absorber), and Great Britain Patent No. 2,176,018A (small amounts of Cyasorb IR 165, 126 or 99 in combination with graphite as the sensitizer/absorber).

To produce these particular imaging media, the sensitizers/absorbers are usually dispersed in commercially available binders and coated onto a laser transparent support. The binders include both self-oxidizing binders, e.g., nitrocellulose, as well as non-self oxidizing binders such as, for example, ethylcellulose, acrylic resins, polymethylmethacrylate, polystyrene, phenolic resins, polyvinylidene chloride, vinyl chloride/vinyl acetate copolymers, cellulosic esters and the like. Since the black body absorbers employed are highly absorbent in the visible and ultraviolet (UV) as well as in the infrared region, the resulting transferred image is always black due to the presence of the absorber. Such ablative transfer imaging based on black body absorbers is therefore entirely ineffective and wholly unsuited for many applications, e.g., color transfer imaging, color proofing, security printing, etc.

It will thus be appreciated that serious need continued to exist in this art for a cost effective photo-induced ablative transfer imaging medium that could be sensitized independently of the contrast imaging material(s), e.g., colorants, and which, therefore, was not limited to contrast materials which must absorb the imaging radiation. Like need existed for an ablative transfer imaging medium that could be sensitized to absorb visible and/or near IR light.

The copending and abandoned Foley et al applications hereinbefore incorporated by reference describe such a novel technique for ablation-transfer imaging/recording that is not dependent upon contrast imaging materials that must absorb the imaging radiation, typically photoradiation and preferably laser radiation, and feature ablation-transfer imaging media that may even be sensitized to absorb visible or near IR light.

In particular, these Foley et al applications describe novel ablation-transfer imaging media comprising a support substrate having an imaging radiation-ablative topcoat essentially coextensive therewith, the imaging radiation-ablative topcoat including an ablation sensitizer and an imaging amount of a non-ablation sensitizing contrast imaging material contained therein, for example:

1. Media that can be employed in a photo-induced ablative transfer process to provide full color images faster than previously possible using current melt or sublimation techniques and that can be tailored to meet a wide variety of specifications for color imaging.

2. Media that can be employed in a photo-induced ablative transfer process to produce masks which selectively block the light from exposure units employed in pre-press production in the graphic arts and printed circuit industries.

3. Media that can be employed in a photo-induced ablative transfer process to produce substantially colorless fluorescent images, e.g., for the security marking of documents.

Nevertheless, it would be further advantageous to provide this art with improved ablation-transfer imaging media having greater sensitivity, requiring less sensitizer and threshold energy (thus permitting a greater range of mass to be transferred), and which additionally are kinetically more rapid and facilitate the ablative transfer to a receptor element of an imaging radiation-ablative topcoat containing virtually any type of contrast imaging material (whether sensitizing or non-sensitizing).

SUMMARY OF THE INVENTION

Accordingly, a major object of the present invention is the provision of improved technique for ablation-transfer imaging/recording that is also not dependent upon contrast imaging materials that must absorb the imaging radiation, which is kinetically rapid, advantageously more sensitive and in that event requiring less sensitizer and threshold energy, and which is characterized by the enhanced ablative transfer of any contrasting pattern of intelligence from the imaging medium to an adjacent receptor element.

Briefly, the present invention features improved method for transferring a contrasting pattern of intelligence from a composite ablation-transfer imaging medium to a receptor element in contiguous registration therewith, said composite ablation-transfer imaging medium comprising a support substrate (i), at least one intermediate dynamic release layer (ii) essentially coextensive therewith and an imaging radiation-ablative carrier topcoat (iii) also essentially coextensive therewith, especially a photo- and more preferably a laser-ablative carrier topcoat, said imaging radiation-ablative carrier topcoat (iii) including an imaging amount of a contrast imaging material contained therein, and said dynamic release layer (ii) absorbing such imaging radiation, e.g., laser energy, at a rate sufficient to effect the imagewise ablation mass transfer of at least said carrier topcoat (iii). In particular, the present invention features improved method comprising imagewise irradiating said composite ablation-transfer imaging medium according to such pattern of intelligence at a rate sufficient to effect the ablation mass transfer of the imagewise-exposed area of at least the radiation-ablative carrier topcoat of said imaging medium securely onto said receptor element and whereby said imaging material delineates said pattern of intelligence thereon.

This invention also features such composite ablation-transfer imaging medium, per se, as well as an organization adopted for ablation-transfer imaging/recording including such composite ablation-transfer imaging medium and a receptor element in contiguous registration therewith, e.g., in face-to-face registered direct contact, or even spaced a slight distance therefrom which can extend up to 25 and in certain instances even up to 100 microns.

The present invention also features an assembly for ablation-transfer imaging/recording comprising the aforesaid organization and means for selectively irradiating, e.g., with laser energy as well as other sources of electromagnetic and even ultrasonic radiation, said composite ablation-transfer imaging medium to effect the ablation mass transfer of at least the selectively-irradiated area of the radiation-ablative carrier topcoat of the imaging medium, and in some cases even together with the corresponding areas of the at least one dynamic release layer itself, securely onto the receptor element.

DETAILED DESCRIPTION OF THE PREFERRED EMBODIMENTS OF THE INVENTION

Figure 1A:
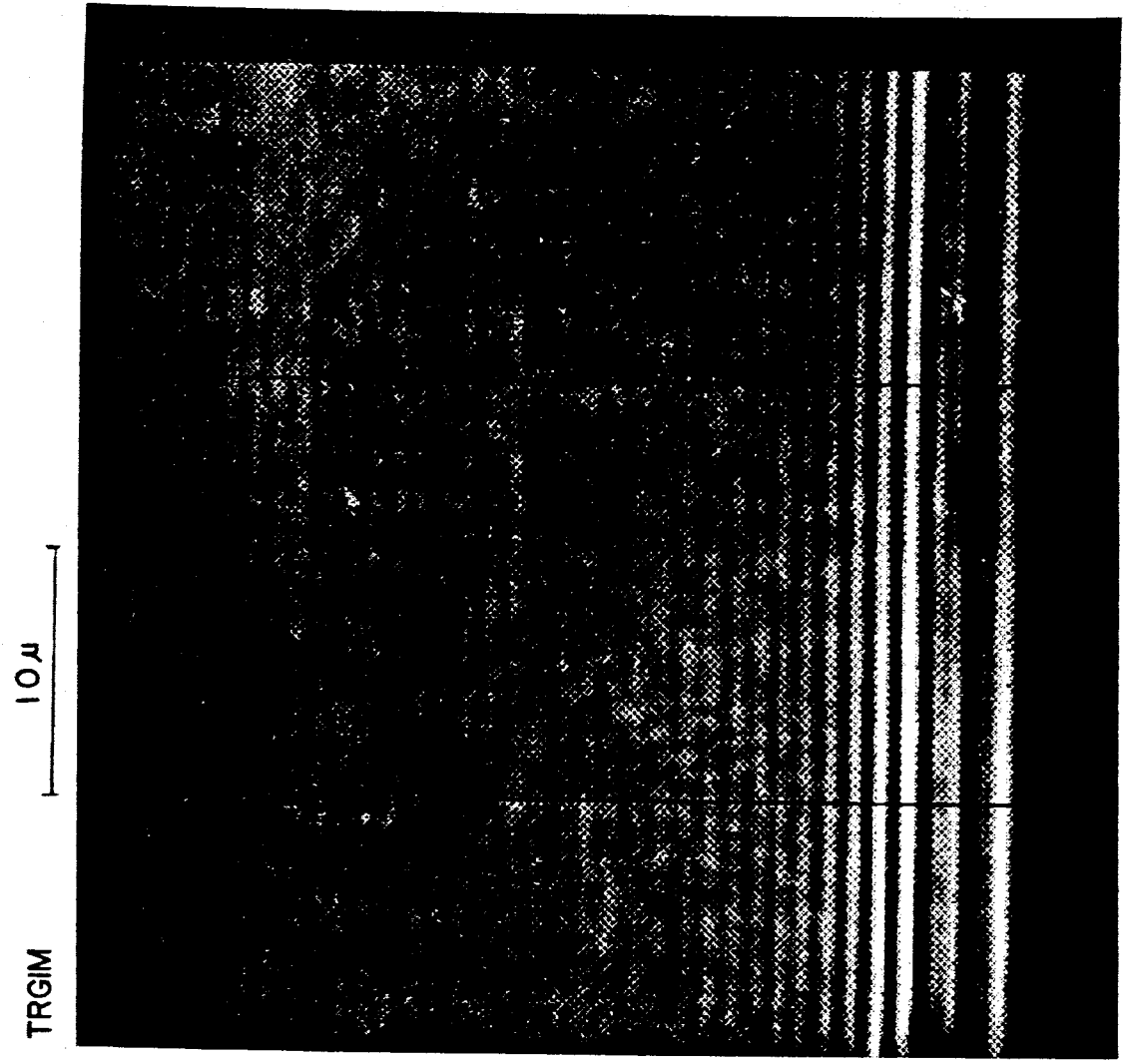
FIG. 1A is a side view photomicrograph of a composite imaging medium according to the present invention and the illuminated space above same, prior to laser exposure.

More particularly according to the present invention, it will be appreciated that the subject composite ablation-transfer imaging medium necessarily includes at least one dynamic release layer (ii) intermediate the support substrate (i) and the imaging radiation-ablative carrier topcoat (iii).

By "dynamic release layer" is intended an intermediate layer that must interact with the imaging radiation to effect imagewise ablative transfer of at least the carrier topcoat onto a receptor element at an energy/fluence less than would be required in the absence thereof. The dynamic release layer is believed to release the carrier topcoat by effectively eliminating the adhesive forces that bond or consolidate the carrier topcoat with the support substrate. Preferably, under the same conditions additional propulsion is simultaneously provided by the interaction of the imaging radiation therewith, e.g., by ablation of the dynamic release layer itself, thus further facilitating the imagewise ablative transfer of the entire carrier topcoat to a receptor element.

The dynamic release layer (DRL) is at least one layer of any organic or inorganic material, or combination thereof, that absorbs at least a fraction of the imaging radiation sufficient to diminish the adhesion (in the imagewise exposed areas) between said at least one DRL and the support substrate, the DRL(s) and the carrier topcoat, or both. Such material can be intrinsically absorbing, or sensitized to absorb wavelengths of the imaging radiation and includes, for example, both black body and non-black body absorbers. Preferably, the DRL(s) are intrinsically or inherently absorbing of the imaging radiation, highly absorbing of the imaging radiation such that very thin layers thereof can be employed, e.g., at least one low melting thin metal film. Further, these materials respond effectively to the imaging radiation on the nanosecond time scale, or even faster.

Exemplary such absorbing materials suitable for the DRL include thin films of metals, metal oxides, and metal sulfides which effectively melt, vaporize or otherwise change physical state when exposed to imaging radiation and preferably have little or no toxicity, have low energy requirements for release and reflect as little of the imaging radiation as possible. Representative such metals are those metallic elements of Groups Ib, IIb, IIIa, IVa, IVb, Va, Vb, VIa, VIb, VIIb and VIII of the Periodic Table, as well as alloys thereof or alloys thereof with elements of Groups Ia, IIa, and IIIb, or mixtures of same. Particularly preferred metals include Al, Bi, Sn, In or Zn, and alloys thereof or alloys thereof with elements of Groups Ia, IIa and IIIb of the Periodic Table, or their mixtures. Suitable such metal oxides and sulfides are those of Al, Bi, Sn, In, Zn, Ti, Cr, Mo, W, Co, Ir, Ni, Pd, Pt, Cu, Ag, Au, Zr or Te, or mixtures thereof.

Other exemplary DRL materials include those that undergo a change in crystal structure upon exposure to imaging radiation, such as germanium or sensitized liquid crystal materials. Also exemplary are those materials described in U.S. Pat. Nos. 4,756,633 and 4,897,310.

Exemplary organic DRL materials comprise sublimable materials and monomeric and polymeric compounds which are intrinsically capable of absorbing imaging radiation, and/or monomeric and polymeric compounds which have been sensitized with black body or non-black body absorbers to impart the necessary absorbance. Representative monomeric compounds include metal phthalocyanines, metal dithiolenes, anthraquinones, etc., which may be, e.g., vacuum deposited in the form of a thin layer. Representative polymeric compounds include the polythiophenes, polyanilines, polyacetylenes, polyphenylenes, polyphenylene sulfides, polypyrroles, and derivatives or mixtures thereof.

Yet other exemplary DRL materials include the combination of any ablation sensitizer/absorber, e.g., any near infrared or visible light sensitizer, in at least one binder which need not be, but may be absorbing at the imaging wavelength, or a sensitized/absorbing binder alone. Advantageously, such binder material is polymeric and preferably comprises those ablative polymers which undergo rapid acid catalyzed partial decomposition; such ablative binder/sensitizer (absorber) compositions are more fully described in the Foley et al applications indicated above, albeit characteristically without any of the contrast imaging material having been incorporated therein.

Depending upon the particular dynamic release material(s) selected and the imaging conditions employed, at least a portion of the DRL may itself be transferred together with the carrier topcoat onto the receptor element during the ablation process. Accordingly, it is preferred that the dynamic release layer itself transfer essentially no contrasting material to the final product, if such is desirable in the intended application. This is particularly preferred when using the ablation-transfer imaging media of the present invention for applications where color fidelity is important, e.g., for color printing and proofing.

The thickness of the at least one dynamic release layer depends upon the material(s) selected therefor. For example, where a metal such as those discussed above is employed as the DRL, a thickness of about one monolayer of the metal to about 500 angstroms is preferred.

The dynamic release layer preferably synergistically interacts with the ablative carrier topcoat to reduce the threshold energy required for transfer. This enables complete carrier topcoat transfer at lower energy inputs thereby requiring only small amounts, and even none at all, of an ablation sensitizer in the carrier topcoat as more fully described below, and also enables the more effective utilization of any other functional additives, also described below.

The composite ablation-transfer imaging media of the present invention also necessarily comprise an imaging radiation-ablative carrier topcoat (iii) essentially coextensive with the support substrate (i) and the at least one DRL (ii).

Such ablative carrier topcoat itself necessarily contains an imaging amount of a contrast imaging material.

By "contrast imaging material" is intended that material used to distinguish the resulting pattern of intelligence transferred to the receptor element.

Such contrast imaging material, moreover, either may or may not itself be an ablation sensitizer capable of promoting ablation-transfer under the intended imaging conditions that result in ablation. Failure of the contrast imaging material to itself initiate or promote ablation (i.e., a "non-ablation sensitizing contrast imaging material") may be the result of a lack of absorbance at the ablation wavelength(s), a lack of sufficient absorbance of same, or a failure of absorbance to result in a pressure build up phenomenon, e.g., the absorbance provides a non-ablation promoting event such as photobleaching, stable triplet, fluorescence or phosphorescence. Thus, the contrast imaging material must be visible or discernible to the detector/technique used to distinguish the resulting pattern of intelligence transferred to the receptor element and/or remaining on the imaging medium, per se.

Exemplary such contrast imaging materials that can be ablatively transferred to a receptor element in a predetermined contrasting pattern of intelligence to visibly or symbolically represent or describe an object or data include colorants (dyes or pigments, including black body absorbers), ultraviolet and infrared absorbing materials, polymeric materials, magnetic materials, fluorescent materials, electrically conducting materials, etc.

Still other additives may be included to enhance the film properties and transfer characteristics. These additives need not function as a contrast imaging material and include, e.g., plasticizers, flow additives, slip agents, light stabilizers, anti-static agents, surfactants, brighteners, anti-oxidants and others known to the formulation art.

In a preferred embodiment of the present invention, the subject ablation-transfer imaging/recording technique is advantageously photo- and more preferably laser-induced, albeit it need not be (for example, any light source of sufficient intensity in the near infrared or visible spectral region is suitable).

Photo- or laser-induced ablation-transfer comprehends a threshold energy below which no effective material transfer occurs and a requirement that the energy be input at a rate greater than the ability of the materials to reverse the factors leading to the aforenoted pressure accumulation, for example by excessive thermal diffusion outside the irradiated area. Thus, imaging radiation capable of exceeding the threshold energy (fluence, joules/cm$^2$) and power density (watts/cm$^2$) is required for effective image transfer. By proper selection of materials and imaging parameters, this latter requirement can lead to exposure times on a nanosecond time scale which is at least ten times faster than exposure times necessary for conventional transfer imaging processes. The actual values of fluence and power density suitable for photo- and laser-induced ablative transfer imaging are dependent on the specific materials employed in the imaging medium and the specific receptor selected. In addition, fluence is power density dependent, particularly in the event that thin metal DRLs are employed.

In a preferred embodiment of the invention, the carrier topcoat also includes an ablation sensitizer (absorber) and at least one ablative binder material which need not be absorbing at the imaging wavelength and which is essentially completely imagewise mass transferred to the receptor element. By "ablation sensitizer" is intended any initiator capable of initiating and promoting the ablation process. It does this by absorbing the imaging radiation and transferring the absorbed energy into an explosive ablative force. Such types of sensitizers/initiators are well known to the recording art as discussed earlier in the context of optical disk writing. Light sensitization for imaging materials is of course also well known to the recording art. Suitable binders include those materials, e.g., polymeric materials, which are effective in adhering the carrier topcoat to the DRL prior to transfer, as well as adhering the transferred material to the receptor element after exposure to imaging radiation.

Advantageously, the ablative binder material referred to above comprises a conventional film-forming polymer providing high visible transparency. Exemplary such film-forming polymers include, but are not limited to, polycarbonates, polysulfones, styrene/a- crylonitrile polymer, polystyrenes, cellulosic ethers and esters, polyacetals, polymethylmethacrylate, polyvinylidene chloride, α-chloroacrylonitrile, maleic acid resins and copolymers, etc.

In another preferred embodiment of the invention, the imaging radiation-ablative carrier topcoat comprises at least one ablation sensitizer which absorbs at the wavelength of the desired laser output, for example in the near infrared spectral region of 760 nm to 3,000 nm, and at least one ablative binder, the at least one sensitizer being present in an amount sufficient to effect the rapid partial decomposition of the at least one binder when the at least one sensitizer interacts with laser light. The ablative binder advantageously comprises those polymeric materials which undergo rapid acid catalyzed partial decomposition, preferably at temperatures less than 200° C. as measured under equilibrium conditions. The carrier topcoat may also, optionally, contain materials which are non-absorbing at the wavelength of the desired laser output and/or non-decomposing.

In another embodiment of the invention, the ablative binders are advantageously those polymeric materials which transfer under the imaging conditions, and are preferably (especially when the DRL comprises an organic absorber), those which undergo rapid acid catalyzed partial decomposition at temperatures of less than about 200° C. as measured under equilibrium conditions, and most preferably at temperatures of less than about 100° C. as measured under equilibrium conditions.

In particular, such ablative binders according to this invention are those binders which decompose rapidly to produce effective amounts of gases and volatile fragments at temperatures of less than about 200° C. as measured under equilibrium conditions and the decomposition temperatures of which are significantly reduced in the presence of small amounts of generated acids. Most preferably, the decomposition temperatures thereof are decreased to less than about 100° C.

Exemplary such polymers include nitrocellulose, polycarbonates and other polymers of the type described in J. M. J. Frechet, F. Bouchard, F. M. Houlihan, B. Kryczke and E. Eichler, *J. Imaging Science*, 30(2), pp. 59–64 (1986), and such other polymers as polyurethanes, polyesters, polyorthoesters and polyacetals, and copolymers thereof. These polymers, as well as certain mechanisms of the decomposition thereof, are also more fully described in the aforenoted Foley et al applications.

In another embodiment of the invention, the carrier topcoat comprises at least one near infrared sensitizer, at least one ablative binder, and at least one hydrogen atom donating material (H·) for the acid catalyzed decomposition of the ablative binder (which may be present in the binder itself). These latter materials include alcohols, thiols, phenols, amines and hydrocarbons, and are also more fully described in the Foley et al applications.

In another preferred embodiment of the present invention, a near infrared laser-ablation transfer imaging medium is provided. Such medium advantageously comprises a near infrared transparent support film bearing at least one DRL and a carrier topcoat of near infrared ablative coating containing a substantially colorless near infrared sensitizer. This medium can be effectively and advantageously employed for color imaging when a colorant is added.

Upon exposure to laser light, the DRL and the absorbing sensitizer interact with laser light to cause rapid release of at least the carrier topcoat and may involve partial decomposition of the DRL and/or carrier topcoat binders to gaseous and non-gaseous products. The rapid expansion of the heated gases assists ablation of the exposed carrier topcoat onto an adjacent receptor sheet providing a reverse of the imaged color film (i.e., a color print or proof).

Suitable absorbing sensitizers according to the present invention include any material which can absorb at a desired wavelength for a particular near infrared or visible imaging wavelength. In particular, where visibly transparent coatings are required, for example, substituted aromatic diamine dication diradical type sensitizers or cation radical sensitizers with counterions derived from strong acids and absorbing in the near IR are preferred. Such sensitizers are also more fully described in said Foley et al applications indicated above. Indeed, it is here reiterated that the binder/sensitizer combinations described in these Foley et al applications, without the contrast imaging material, may serve as the at least one dynamic release layer according to this invention.

Examples of these sensitizers include the series of near infrared absorbers marketed under the trademarks Cyasorb IR 165, 126 and 99 by American Cyanamid, as well as those IR absorbers described in U.S. Pat. No. 4,656,121, hereby expressly incorporated by reference.

Radiation sources emitting near infrared wavelengths in combination with visibly colorless sensitizers are preferred for high fidelity color imaging applications. In other applications, any radiation source of sufficient intensity, typically not less than about $10^4$ watts/cm$^2$, emitting in the visible and/or near infrared can be employed for photo-ablation without limitation to black body sensitizers as essentially required by the prior art. The sensitizers of the present invention are most preferably highly absorbing at the wavelengths of the imaging radiation and soluble in the binders employed. Examples of suitable non-black body sensitizers which can be effectively employed in the ablative topcoat are cyanine dyes, phthalocyanine dyes, metal dithiolenes, methylene blue salts, di- and triarylmethane cation salts, Wurster's blue salts, and other visibly or near infrared absorbing onium salts derived from strong acids, etc. Various of these are described in U.S. Pat. Nos. 4,315,983, 4,508,811, 4,948,776, 4,948,777, 4,948,778 and 4,950,640, also hereby expressly incorporated by reference.

The support substrates (i) employed can be either support films transparent to the imaging radiation or non-transparent such support films. Transparent support films which can be employed include glass, polyesters (by reason of their high optical clarity and dimensional stability), polycarbonates, polyurethanes, polyolefins, polyamides, polysulfones, polystyrenes, cellulosics and any support substrate which does not dissolve in the coating solvents employed, with polyesters being preferred. Examples of non-transparent supports include any non-transparent support substrate which would not dissolve in the coating solvents employed. These supports can include filled and/or coated opaque polyesters, aluminum supports, such as used in printing plates, and silicon chips. The thickness of such support substrates is not critical and can vary widely, same depending, for example, upon the particular intended application and whether irradiated from the front or back surface thereof.

An anti-reflection layer (vis-a-vis the imaging radiation) may optionally be provided on the face surface of the support opposite the ablative carrier topcoat and/or on the receptor element, to enhance the efficiency of the ablative transfer by enabling more of the imaging radiation to be effectively utilized.

Such anti-reflection layer advantageously comprises one or more materials which are recognized for this purpose in the recording art, for example those described in U.S. Pat. Nos. 3,793,022 and 4,769,306, and are also applied in known manner. Suitable materials, e.g., for a polyester support substrate having a refractive index of about 1.6, are coatable materials having refractive indices of about 1.3 to 1.4. Exemplary such materials include Fluorad ™ FC-721 from 3M Co., $CaF_2$, $MgF_2$, fluoropolymer, etc. The thickness of the anti-reflection layer(s) is selected as to provide the desired refractive properties for the layer(s) with respect to the wavelengths of the imaging radiation. For example, where Fluorad ™ FC-721 is employed as the antireflection layer and 1064 nm imaging radiation is used, a thickness of about 0.2 to 0.25 microns is effective.

To fabricate the ablation-transfer imaging media of this invention, the dynamic release layer is deposited onto appropriate support substrate by any means well known to this art, e.g., vapor deposition, sputtering, wet deposition, etc.

The DRL side of the resulting intermediate article is then overcoated with a solution or dispersion of the constituents of the carrier topcoat by coating techniques also well known to this art, such as Meyer rod coating, gravure coating, reverse roll coating, modified bead coating, extrusion coating, etc., and the coated article is dried. The coating solution or dispersion contains solvent(s), the contrast imaging material, any binder(s) and sensitizer(s), additives, etc., depending upon the intended final application.

The solvents employed in the present invention are preferably those which dissolve both the binders and the optional sensitizers. Exemplary such solvents include, but are not limited to, water, alcohols, esters, ketones, aliphatic and aromatic hydrocarbons, chlorinated aliphatic and aromatic hydrocarbons, nitro aliphatic and aromatic hydrocarbons, amides and others known to the formulation art.

The thickness of the dynamic release layer(s) is optimized to provide for the total transfer of the carrier topcoat to the receptor element with a minimum energy requirement (joules/$cm^2$). The thickness of the carrier layer is optimized to provide the amounts of material required for a particular application; for example, an amount of dye or pigment necessary to meet a density requirement on the receptor element or an amount of UV absorber required to meet a UV blocking specification of the donor medium or mask.

The composite imaging media of the present invention are useful for a wide variety of applications, including color printing and color proofing. Other than these, and depending upon the nature of the contrast imaging material contained in the ablative carrier topcoat (whether or not also containing an ablation sensitizer), the subject composite imaging media may include a UV absorber and thus be adopted for the production of exposure masks, and infrared dye for generating machine readable images, e.g., bar codes, magnetic particles for preparing machine readable documents, fluorescent materials for coding security documents, or electrically conductive materials for the production of electronic components, e.g., printed circuit boards and other direct-to-plate and direct-to-board applications, etc.

In one embodiment of this invention, providing an imaging medium well suited, e.g., for color proofing, the carrier topcoat includes a sensitizer selected as to be substantially non-absorbing in the visible spectral region (380–760 nm) and a pigment dispersion of a colorant supplied as a nitrocellulose based printing ink. The sensitizer is present in an amount of about 0.05% to about 50% by weight of dry solids. Preferably, the sensitizer is present in an amount of 2% to 25% by weight of dry solids. The total amount of dry solids (grams/$meter^2$) is adjusted to meet American Newspaper Publishers Association (A.N.P.A.) or Specifications for Web Offset Publications (S.W.O.P.) density specifications for solid color densities transferred to the receptor element, e.g., known commercial newsprint. The dynamic release layer is advantageously a thin metal film applied to a support substrate, e.g., a polyester film. Preferably, the thin metal film is a low melting, low-toxicity metal or metal alloy of Al, Bi, Sn, In and/or Zn. The thickness of the metal film advantageously ranges from one monolayer to about 500 angstroms, the optimal thickness depending on the particular metal. By "color proofing" is of course intended that technique, very well known to the recording art, of predicting or confirming one or more aspects of color printing prior to press, e.g., color rendition, tonal rendition, registration, composition, and the like.

In another embodiment of the composite imaging medium of the invention, also well suited for color proofing and printing applications, the carrier topcoat is also deposited onto the DRL (and then dried) as a pigment dispersion of a colorant, i.e., a nitrocellulose based printing ink, but contains no sensitizer. The dynamic release matrix is again a thin metal film applied onto a polyester film support substrate. Preferably, the thin metal film is a low melting, low-toxicity metal or metal alloy of Al, Bi, Sn, In and/or Zn. The thickness of the metal film can again range from one monolayer to about 500 angstroms, the optimal thickness depending on the particular metal employed. In this embodiment, the receptor element to which the proof/print is transferred, by reason of the absence of the ablation-promoting sensitizer, is advantageously passively adhesively coated, e.g., with a hot melt adhesive, to assist securing the ablated image thereto.

In another embodiment, i.e., masking, in which the imaging media can be effectively employed as an exposure mask for use in graphic arts or printed circuit preproduction, the contrast imaging material is an absorber which is effective in blocking the light output from common exposure devices. Exemplary such materials are black body absorbers, e.g., carbon black, graphite, chromium dioxide, and non-black body absorbers, e.g., azo derivatives, oxadiazole derivatives, dicinnamalacetone derivatives, benzophenone derivatives, etc. By "masking" is intended that operation, also very well known to the recording art, including blanket exposure of a typically light sensitive material, e.g., printing plate, resist, diazo, etc., through a pre-existing pattern of intelligence, e.g., a "mask", which selectively blocks the exposure radiation according to the pattern of intelligence, e g., a printed circuit, newspaper page, etc. One specific example of an imaging medium well suited for such applications comprises a polyester film support substrate, a thin metal film dynamic release layer, e.g., an Al, Bi, Sn, In and/or Zn thin film, or thin film of an alloy thereof, or a black body absorber, e.g., graphite or carbon black, in a binder polymer, and an ablative carrier topcoat comprising a nitrocellulose based printing ink vehicle, curcumin, and, optionally, a sensitizer, e.g., a cation radical or a dication diradical derivative of a triarylamine compound.

In still another embodiment, in which the imaging media can be effectively employed in a security printing application, the contrast imaging materials are substantially colorless, but which fluoresce in the visible region when exposed to ultraviolet light. Representative such materials include oxazole derivatives, oxadiazole derivatives, coumarin derivatives, carbostyryl derivatives, etc. One specific example of an imaging medium well suited for such applications comprises a polyester film support substrate, a thin metal film dynamic release layer, e.g., an Al, Bi, Sn, In and/or Zn thin film, or thin film of an alloy thereof, and an ablative carrier topcoat comprising a nitrocellulose based printing ink vehicle, bis(4-diethylaminophenyl)oxadiazole, and, optionally, a sensitizer, e.g., a cation radical or a dication diradical of a triarylamine compound.

In another embodiment, the contrast imaging material is readable by means of a near infrared scanner, e.g., a bar code. Exemplary such materials for this particular embodiment include metal dithiolene derivatives, phthalocyanine derivatives, triarylamine derivatives, graphite, carbon black, chromium dioxide and mixtures thereof. One specific example of an imaging medium well suited for these applications comprises a polyester film support substrate, a thin metal film dynamic release layer, e.g., an Al, Bi, Sn, In and/or Zn thin film, or thin film of an alloy thereof, and an ablative carrier topcoat comprising a nitrocellulose based ink vehicle, a phthalocyanine derivative, and, optionally, a sensitizer, e.g., a cation radical or a dication diradical of a triarylamine compound.

In yet another embodiment, the contrast imaging material is magnetic, for the production of such machine readable items as information strips, checks, credit cards, etc. Exemplary thereof are iron, iron oxide, cobalt-iron oxide, barium ferrite, mixtures of the above, and the like.

In still another embodiment, the contrast imaging material includes at least one additive which comprises a hydrophobic ink accepting resin for transfer to a grained aluminum surface used, for example, in the production of offset lithographic plates. Suitable additives for this application comprise phenol-formaldehyde resins, crosslinked polyvinyl alcohol resins, crosslinked epoxy resins, etc.

In a further embodiment, the contrast imaging material includes at least one additive which comprises an electrically conductive material for transfer to an insulating surface used, for example, in the production of printed circuits. Suitable additives for this application comprise conductive dispersions of graphite, silver, aluminum, copper, etc.

In each of the above embodiments, the imaging medium preferably includes an anti-reflection layer, as above described, on the face surface of the support substrate opposite the DRL and comprising, for example, a fluoropolymer, magnesium fluoride or calcium fluoride.

Figure 1B:
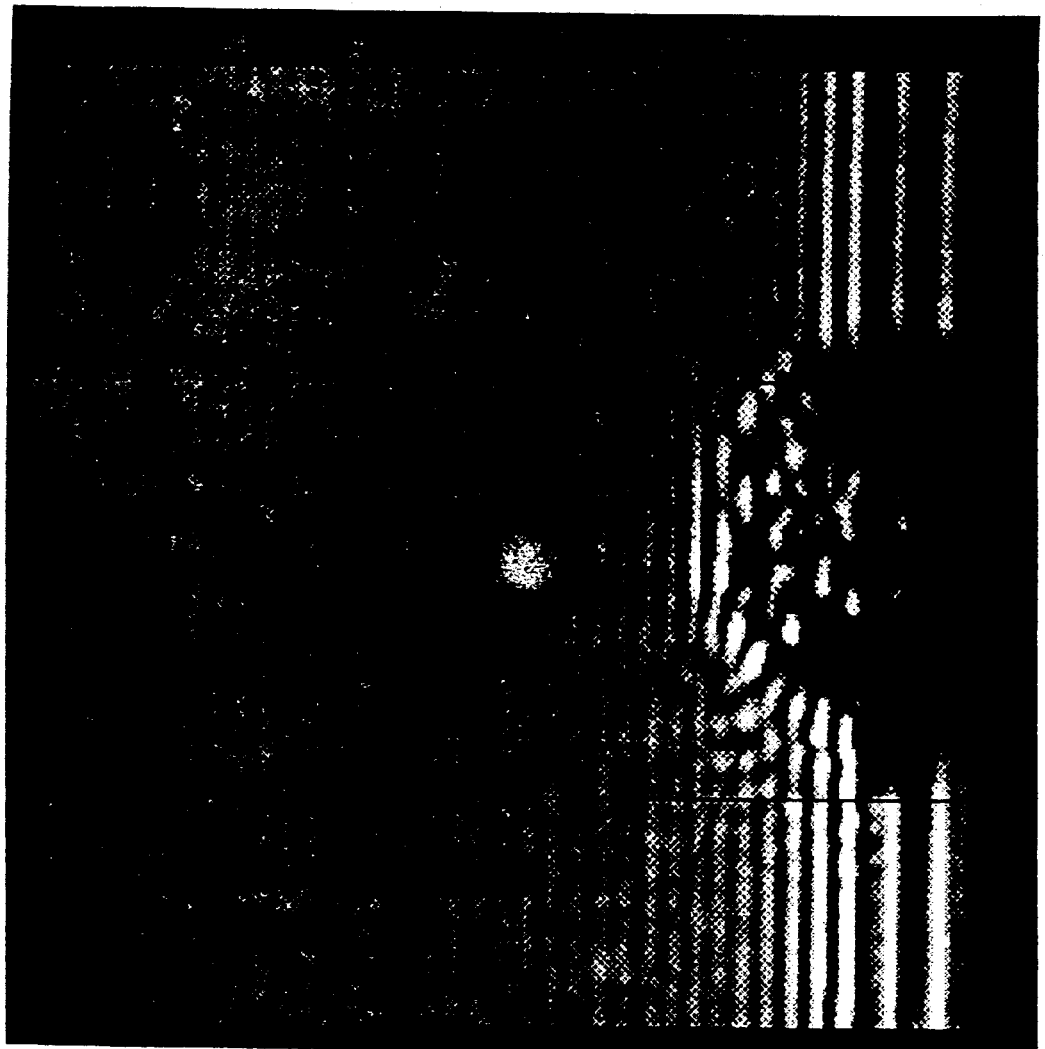
FIG. 1B is a like photomicrograph taken under identical conditions, but 100 nanoseconds after initiation of a 260 nanosecond laser pulse directed through the support substrate of said composite imaging medium and into the dynamic release layer and ablative topcoat thereof.

The material transfer phenomenon of the laser-induced ablation process of the present invention is illustrated by the photomicrographs obtained by time resolved grazing incident microscopy, TRGIM, in FIGS. 1A and 1B.

FIG. 1A is a side view photomicrograph of a composite imaging medium of the invention and the illuminated space thereabove (in lieu of a receptor element), prior to laser exposure.

FIG. 1B is a like photomicrograph, taken 100 nanoseconds after the initiation of a 260 nanosecond pulse from a Nd:YAG laser, 5, directed through the polyester support, 4, about $\frac{1}{4}$" from the edge thereof and into the dynamic release layer, 3, and absorbing ablative topcoat, 2 (the imaging medium, per se, is more fully described in the Example 1 which follows), to produce a plume, 6, of ablated materials. The horizontal lines, 1, in the space above the medium are interference lines resulting from the use of coherent probe illumination. The Nd:YAG laser (1064 nm output from a Quantronics 116FL-O laser controlled by an Anderson Laboratories' DLM-40-IR2.7 acousto-optic modulator and a 40 MHz signal processor) delivered 0.6 J/cm$^2$ in a 25 micron diameter beam (1/e$^2$).

Figure 2A:
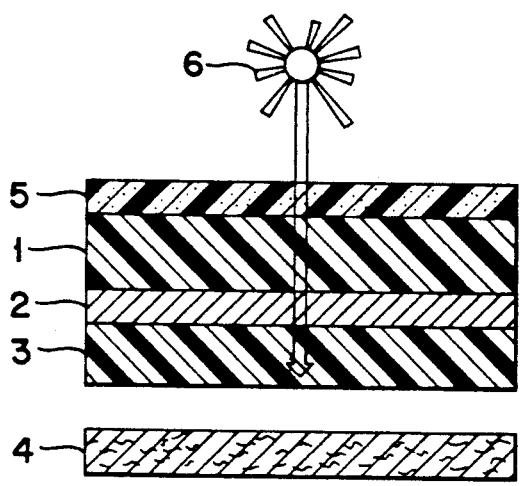
FIGS. 2A and 2B are schematic/diagrammatic illustrations of the method/system according to the present invention, including one embodiment of the composite imaging medium wherein the support substrate thereof is transparent to the imaging radiation.
Figure 2B:
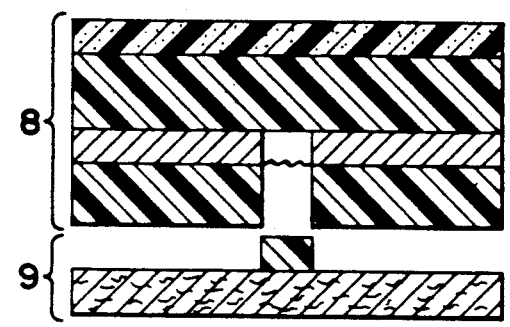

FIG. 2 illustrates the use of an imaging radiation transparent support substrate in the method of the present invention. In this embodiment, imaging radiation, 6, impinges upon the imaging material which comprises an anti-reflection first layer, 5, an imaging radiation transparent support substrate, 1, a dynamic release layer, 2, and an ablative carrier topcoat, 3. Also shown is a receptor element, 4, in contiguous registration therewith.

Figure 3A:
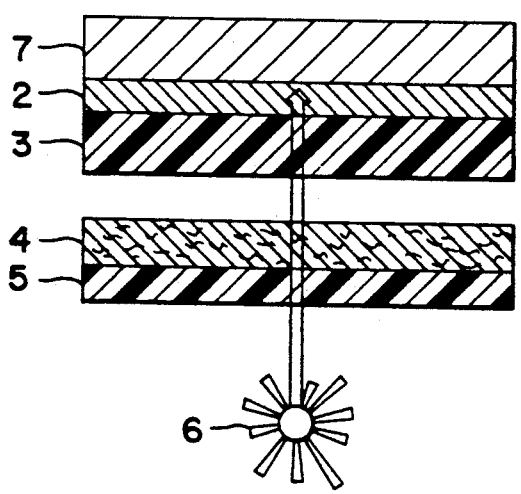
FIGS. 3A and 3B are schematic/diagrammatic illustrations of another method/system of this invention, including a second embodiment of the composite imaging medium wherein the support substrate thereof is not transparent to the imaging radiation.
Figure 3B:
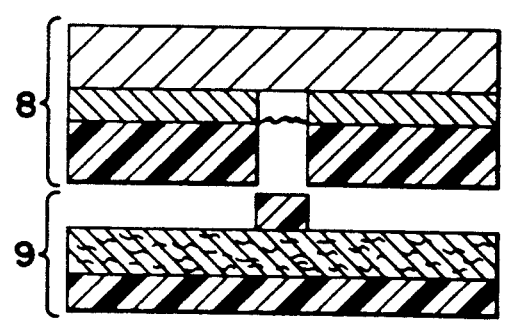

FIG. 3 illustrates an alternative embodiment of the present invention wherein the imaging material comprises a nontransparent support substrate, 7. In this embodiment, the receptor element, 4, is made of imaging radiation transparent material and is provided with an anti-reflection back layer, 5. The imaging radiation, 6, impinges upon the imaging material from the front or through the receptor element, into the ablative carrier topcoat, 3, and dynamic release layer, 2.

In either embodiment, a pattern of imaging radiation at the desired wavelength(s) is directed into the absorbing layer(s). This causes ablation of at least the carrier topcoat and its transfer to the receptor element, thus producing an imaged donor film, 8, and a corresponding image of opposite sign, 9, on the receptor element.

The imaging radiation employed in this invention includes wavelengths in the visible and near infrared spectral regions. Near infrared radiation is preferred for color proofing and printing applications because the sensitizers, when indeed they are employed for a particular application, can be substantially colorless in the visible region and thus will not adversely affect the color fidelity of the transferred image on the receptor element.

Exemplary radiation emitting devices for imagewise exposing the composite imaging media of the invention include solid state lasers, semiconductor diode lasers, gas lasers, dye lasers, xenon lamps, mercury arc lamps, and other visible and near infrared radiation sources which are capable of providing sufficient energy to equal, or exceed, the threshold energy for ablation transfer and of providing this energy at such a rate as to institute that phenomenon of transient pressure accumulation discussed earlier and believed responsible for the ablative transfer process.

The actual value of threshold energy is intensity dependent as well as materials dependent. Typically, when employing imaging media constructions comprising a dynamic release layer composed of high thermal conductivity thin metal films, such as aluminum, at least 50 mJ/cm$^2$ at 10$^6$ watts/cm$^2$ is required, while at least 100 mJ/cm$^2$ at 10$^4$ watts/cm$^2$ is more typical for organic constructions. When these conditions are not satisfied, undesirable processes rather than, or in addition to, ablation-transfer may occur, e.g., melting, sublimation, charring, etc. Incomplete transfer and/or image quality degradation may result. Other constraints on the exposure device include the ability to focus the imaging radiation to a desirable spot size and depth and to modulate the radiation at dwell times suitable for the desired imaging application.

Particularly representative devices for providing the imaging radiation include lasers such as Nd:YAG lasers emitting at 1064 nm, for example that incorporated in the imaging hardware of the Crosfield Datrax 765 laser facsimile writer, laser diode systems emitting at 780-840 nm, or other radiation sources designed to provide a power density of 10$^4$ watts/cm$^2$ or greater.

The radiation source is preferably focused to provide the most efficient utilization of energy when it is impinged upon the imaging medium.

The receptor element need not be specially treated or selected to effectively receive materials from the donor medium and can include, for example, those which are well-known in the art of proofing and printing, such as newsprint, coated or uncoated papers of all shades and color, opaque filled and opaque coated plastic sheets, with the printing stock to be employed in the particular color proofing application being preferred. Other suitable receptors include fabrics, wood, cardboard, glass, ceramics, leather, metals such as aluminum and copper, rubber, papers and plastics generally, etc. While the receptor element need not be specially treated or selected to assist in the ablation-transfer process, as indicated above, it is nonetheless also within the scope of this invention to employ a treated or coated receptor, for example a receptor sheet coated with an effective amount of an adhesive or sizing, to aid in the adhesion of the ablated carrier topcoat thereto at lower energy than otherwise would be required.

The imaging medium is most advantageously positioned and firmly maintained in face-to-face registered direct contact with the particular receptor element selected, to facilely transfer ablated carrier topcoat thereto, by any means suitable for such purpose, e.g., positive pressure, a vacuum, or even by the adhesive properties of the receptor element itself.

From the foregoing, it will be seen that the present invention provides numerous advantages and a versatility hitherto alien to this art. Primarily, by reason of the DRL interlayer, the subject composite imaging media are significantly more sensitive to imaging radiation, certain constructions being at least twice as sensitive using far less sensitizer, e.g., at least 75% less, at about half the thickness of the ablative topcoat, to achieve a comparable image density on the receptor element. Correspondingly, the energy/power requirements for a clean transfer are significantly decreased.-Moreover, the ablative carrier topcoat need not itself be sensitized, albeit this is optional; rather, only the dynamic release layer is required to be sensitive to the imaging radiation.

In like vein, selection of binder material is expanded and any required amount thereof lessened per the present invention, as decomposable binders are not required, as is the selection of appropriate sensitizers, e.g., even black body absorbers or none at all may be included in the ablative carrier topcoats according to the invention. Also, any light source of sufficient intensity may constitute the imaging radiation, whether in the near infrared or visible spectral region, i.e., this invention is not laser limited.

Further, the distribution of energy absorption in the DRL and ablative topcoat is optimized per the present invention and the ablative process is kinetically much faster, a not insubstantial attribute, considering that this permits much faster access to the desired final product.

It too will be appreciated that a very primary advantage of the invention is its flexibility in enabling virtually any type of topcoat material/pattern of intelligence to be transferred to virtually any receptor element.

In order to further illustrate the present invention and the advantages associated therewith, the following specific examples are given, it being understood that the same are intended only as illustrative and in nowise limitative.

In said examples to follow, all parts and percentages are given by weight, unless otherwise indicated.

EXAMPLE 1

This example describes the production of various composite ablation-transfer imaging media of the present invention and also the use of same to prepare a newspaper multi-color proof.

Near infrared sensitized formulations of cyan, magenta and yellow gravure (flexo) ink dispersions (marketed by American Inks & Coatings Corp.), as well as a black, graphite colloidal suspension (custom made by Acheson Colloids Co. and described in U.S. Pat. No. 4,245,003) were separately machine coated by a modified bead coating technique, to a dry thickness of about 0.5$\mu$, the three colorant inks onto the metallized face surfaces of three 25 inch wide webs of 50% transmission aluminized 4.6 mil ICI Melinex 505 polyester film to produce three imaging media and the black suspension onto a 25 inch web of 4.6 mil ICI Melinex 516 polyester film to produce a fourth imaging medium.

Carrier Topcoat Coating Formulations:

Near Infrared Sensitizer (1064 nm): Cyasorb TM IR 165 (American Cyanamid Corp., Glendale Protective Technologies Division).

Cyan Dispersion 2.44 lbs Ink (93-405 marketed by American Inks & Coatings),
0.08 lbs IR 165,
19.4 lbs Solvents (50% Methyl Ethyl Ketone (MEK), 20% Methyl Propyl Ketone (MPK), 15% n-Butyl acetate (n-BuAc) & 15% Cyclohexanone).

Magenta Dispersion 2.88 lbs Ink (93-418 marketed by American Inks & Coatings),
0.08 lbs IR 165,
23.2 lbs Solvents (50% MEK, 20% MPK, 15% n-BuAc & 15% Cyclohexanone).

Yellow Dispersion 2.62 lbs Ink (93-4149 marketed by American Inks & Coatings),
0.08 lbs IR 165
21.9 lbs Solvents (50% MEK, 20% MPK, 15% n-BuAc & 15% Cyclohexanone).

Black Suspension 7.5 lbs Graphite Suspension obtained from Acheson Colloids Co., 20.5 lbs. Solvents (50% MEK, 20% MPK, 15% n-BuAc & 15% Cyclohexanone).

The dry optical transmission densities of the imaging media thus produced, determined using a Macbeth Densitometer (TD-904), were: CYAN=0.72 density units (d.u.); MAGENTA=0.63 d.u.; YELLOW=0.73 d.u.; BLACK=1.39 d.u.

A four color proof was produced on a Crosfield Datrax 765 reader/writer from the Color Test Negative color separations provided by the American Newspaper Publishers Association (A.N.P.A.). The respective color-separated images were scanned by the reader and converted to registered digital electronic signals and transmitted sequentially to the laser writer, a scanning YAG laser adjusted to write 1,200 lines per inch at 7.5 watts (fluence 160 mJ/cm$^2$, power density $10^6$ watts/cm$^2$, beam diameter 25 microns (1/e$^2$), dwell time about 104 nanoseconds). A proof or print was produced by serially and successively placing the aforesaid four imaging media in direct face-to-face contact with a common newspaper stock receptor sheet securely maintained in place by vacuum in the laser writer and respectively imaging/exposing same.

The carrier topcoats of the four imaging media were imagewise ablated to the newspaper receptor sheet in primary color areas at the following optical reflection densities (measured using a X-Rite 428 densitometer):

| | |
|---|---|
| CYAN: | 0.96 d.u. vs. 0.90 d.u., A.N.P.A. specification |
| MAGENTA: | 0.89 d.u. vs. 0.90 d.u., A.N.P.A. specification |
| YELLOW: | 0.87 d.u. vs. 0.85 d.u., A.N.P.A. specification |
| BLACK: | 1.12 d.u. vs. 1.05 d.u., A.N.P.A. specification |

The 16"×24" multi-color proof thus produced, in about 10 minutes, corresponded favorably to a newspaper press print produced from printing inks containing the same pigments and printing plates produced from the same color-separation negatives.

EXAMPLE 2

This example describes the production of various composite ablation-transfer imaging media of the present invention and also the use of same to prepare a magazine multi-color proof.

The dispersions/suspension prepared as in Example 1 were coated onto the metallized face surfaces of aluminized polyester films of 50% transmission by hand drawdown using a #7 Meyer rod (cyan), a #5 Meyer rod (magenta) and #3 Meyer rod (yellow). The black suspension was hand coated onto ICI Melinex 516 polyester film using a #9 Meyer rod. The four imaging media were sequentially ablated (Datrax writer adjusted to 1,200 lpi resolution and 8.5 watts, fluence 180 mJ/cm$^2$) onto a #5 ground wood receptor sheet (Ad-Proof Enamel TM from Appleton Paper Inc.) of about 70% brightness and about 60 lb. basis weight, by the technique of Example 1, to provide the following optical reflection densities:

| | |
|---|---|
| CYAN: | 1.50 d.u. vs. 1.50 d.u., S.W.O.P. specification |
| MAGENTA: | 1.43 d.u. vs. 1.45 d.u., S.W.O.P. specification |
| YELLOW: | 1.05 d.u. vs. 1.05 d.u., S.W.O.P. specification |
| BLACK: | 1.30 d.u. vs. 1.60 d.u., S.W.O.P. specification |

EXAMPLE 3

This example relates to providing an anti-reflection (AR) layer, or coating, on the back surface of a composite ablation-transfer imaging medium of the invention and reports certain comparative data obtained by ablating the AR coated and uncoated imaging media onto two different substrates.

The uncoated, raw polyester side of a machine coated, 8"×10" magenta composite imaging medium prepared as in Example 1 was coated with Fluorad TM FC-721, a 3M fluorochemical coating solution having a refractive index of about 1.36, to a thickness of about 0.2$\mu$ to 0.25$\mu$ (cross-sections were measured with a scanning electron microscope) using a #4 Meyer rod. The AR coated imaging medium and an uncoated control imaging medium of the same sample were ablatively imaged onto plain, untreated white paper and onto newspaper stock using a Crosfield Datrax 765 Nd:YAG laser writer. The comparative results obtained are reported in Table I below:

TABLE I

| IMAGING MEDIUM | WATTS AT 1,200 lines/inch | RECEPTOR | % MAGENTA INK COATING TRANSFERRED |
|---|---|---|---|
| AR Coated | 4.0 | plain paper | 38.5 |
| Uncoated | 4.0 | plain paper | 10 |
| AR Coated | 5.0 | plain paper | 100 |
| Uncoated | 5.0 | plain paper | 41.4 |
| AR Coated | 5.0 | newspaper | 100 |
| Uncoated | 5.0 | newspaper | 50.5 |
| Uncoated | 5.5 | newspaper | 100 |

EXAMPLE 4

This example compares the imaging properties of a variety of binder polymers constituting the ablative carrier topcoat of the composite ablation-transfer imaging media according to the invention.

The imaging properties of a variety of solvent soluble polymers were compared. Each resin (0.2 grams) was added to 9.8 grams of a mixture containing 0.3% of 2,5-dimethyl-3-hexyne-2,5-diol, 0.7% Cyasort TM IR 165, and 5% of Morfast Yellow 101 by weight. The solvents selected were a 50:50 mixture of methylene chloride and 1,1,1-trichloroethane or a 50:20:15:15 mixture of methyl ethyl ketone, methyl propyl ketone, n-butyl acetate and cyclohexanone. Appropriate corrections were made for the density differences between the two solvent blends.

Films were prepared by coating the above solutions onto 50% transmission aluminized polyester with a #3 Meyer rod, to a transmission density (blue filter) of 0.60. The films were then ablated at three power settings on a Crosfield Datrax 765 Writer with a Nd:YAG laser onto an uncoated white paper to provide a maximum reflectance density of 0.75.

The following Table II reports the results of this experiment as the amount transferred at three power settings expressed as a percentage calculated by:

measured density/maximum density×100%.

TABLE II

| Binder Polymer | Power (Watts) Fluence (Joules/cm²) | | |
|---|---|---|---|
| | 6 W 0.13 J/cm² | 4 W 0.09 J/cm² | 3 W 0.06 J/cm² |
| Frechet Polycarbonate | 100% | 75% | 45% |
| Bisphenol A Polycarbonate | 100% | 75% | 0% |
| Polysulfone | 100% | 50% | 0% |
| Styrene/Acrylonitrile | 100% | 65% | 0% |
| α-Methylstyrene | 100% | 71% | 25% |
| 0.5 sec Cellulose Propionate | 93% | 16% | 0% |
| Ethylcellulose | 94% | 36% | 0% |
| Polystyrene | 100% | 64% | 20% |
| Butvar ™ | 87% | 25% | 0% |
| Polymethylmethacrylate | 96% | 33% | 0% |
| Unirez ™ 7093 | 100% | 70% | 20% |
| Saran ™ 120 | 94% | 48% | 0% |
| α-Chloroacrylonitrile | 90% | 30% | 0% |
| Nitrocellulose SS | 100% | 75% | 30% |

EXAMPLE 5

Figure 4:
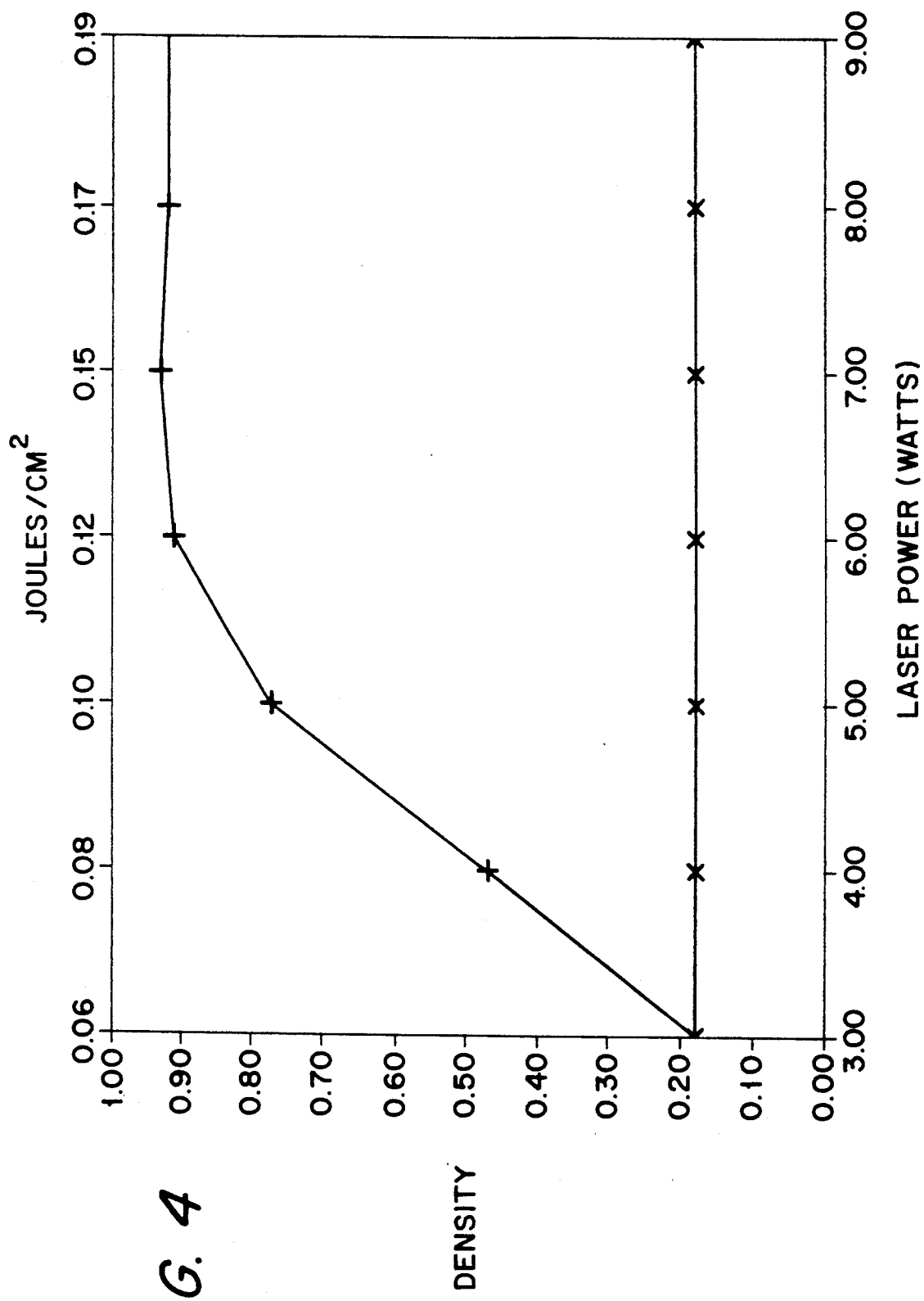
FIG. 4 is a graph plotting transferred image density versus laser power and illustrates the greater imaging sensitivity attained using a composite imaging medium of the invention.

Imaging sensitivity plots (Laser Power vs. Cyan Density Transferred to the Receptor Sheet) derived from the cyan imaging medium and receptor sheets A as described in Example 1, and a similar cyan imaging medium/receptor B organization, but the latter imaging medium being devoid of a dynamic release layer, were compared. A Datrax writer was adjusted to print solid patches of cyan colorant, i.e., maximum density, at 1,200 lines/inch for 3 watts, 4 watts, 5 watts, 6, watts, 7 watts and 8 watts of power. Average cyan densities, plus paper, were measured on each receptor at each power setting and plotted as shown in the graph of FIG. 4.

EXAMPLE 6

This example describes the production of various composite ablation-transfer imaging media of the present invention, the carrier topcoat thereof being devoid of any sensitizer, and also the use of same to prepare a multi-color proof on an adhesively coated receptor element.

The cyan (C), magenta (M), and yellow (Y) carrier topcoating formulations of Example 1, but without any IR 165 sensitizer being added thereto, were coated by the method described onto the metallized face surface of 50% transmission aluminized 4.6 mil ICI Melinex 505 polyester film. These imaging media plus the black (K) imaging medium of Example 1 were used to ablate a four color print onto a specially coated receptor sheet using the same imaging/exposure device and under the same writing conditions of Example 1. The receptor sheet was prepared by sequentially coating a plain white paper with 3M Spray Mount ™ adhesive prior to the successive ablative transfer of images from the respective imaging media, in the order Y,M,C,K. Finally, a protective clear polyester sheet was laminated to the finished print.

EXAMPLE 7

Magenta formulations according to Example 1 were prepared, both with and without the addition of the IR 165. Both formulations were coated as in Example 1 to provide a transmission density of 0.60 ±0.05 units (green filter). The following receptor sheets were used:

1. Kimdura synthetic paper (Kimberly-Clark) as received.
2. Kimdura synthetic paper overcoated with a hot melt adhesive. The overcoating composition included the hot melt adhesive, i.e., Elvax 40W (Dupont, ethylene/vinyl acetate copolymer), 1 gram, and the tackifier, Foral 105 (Hercules, modified rosin ester), 1 gram, as well as a solvent blend (toluene/isopropanol, 90:10), 8 grams, and was applied by hand drawdown using a #10 Meyer rod, and air dried.

Magenta imaging media with and without sensitizer were imagewise ablated as described in Example 1 using the magenta film separation from the color test negative supplied by the American Newspaper Publisher's Association. The results and reflection densities reported in the following Table III were obtained:

TABLE III

| Imaging Medium | Receptor 1 | Receptor 2 |
|---|---|---|
| Magenta film without IR 165 | no adhesion to receptor | 0.90 ± 0.05 at 100% dot |
| Magenta film with IR 165 | 0.90 ± 0.05 at 100% dot | 1.00 ± 0.05 at 100% dot |

EXAMPLE 8

A mask was prepared by coating a solution of Carbon Black pigmented Gravure Ink obtained from American Inks & Coatings, as received, over an aluminized polyester film as described in Example 1. The receptor sheet was overcoated as in Example 7. Samples were ablatively imaged by the procedure of Example 1 at 8W (0.17 J/cm²) and 5W (0.10 J/cm²) using a black and white checkerboard original image target. The results are reported in the following Table IV:

TABLE IV

| | 5 W (0.10 J/cm²) | 8 W (0.17 J/cm²) | Filter |
|---|---|---|---|
| Imaging Medium Mask Density (transmission) | | | |
| Dmax/Dmin | 3.2 ± 0.4/0.12 | 3.2 ± 0.4/0.07 | Vis |
| Dmax/Dmin | 3.9 ± 0.4/0.12 | 3.9 ± 0.4/0.08 | 18A |
| Dmax/Dmin | 3.3 ± 0.4/0.12 | 3.2 ± 0.4/0.07 | Red |
| Dmax/Dmin | 3.5 ± 0.4/0.11 | 3.3 ± 0.4/0.07 | Blue |
| Dmax/Dmin | 3.2 ± 0.4/0.12 | 3.2 ± 0.4/0.07 | Green |
| Receptor Density (reflection) | | | |
| Dmax/Dmin | 2.29 ± 0.06/0.08 | 2.11 ± 0.06/0.08 | Vis |

EXAMPLE 9

A mask, i.e., a negative or positive transparency useful for the production of proof copies or for imaging conventional photolithographic printing plates, etc., was prepared by coating the following formulation:

(i) 6.50 grams Gravure Black Ink (American Inks & Coatings Corp.), (ii) 41.0 grams solvent (50% MEK, 20% MPK, 15% n-BuAc, 15% cyclohexanone), and (iii) 2.00 grams 2,5-bis(4-diethylaminophenyl)-1,3,4-oxadiazole (Aldrich Chemical Co.) onto the aluminized side of a 50% transmission aluminized polyester film as described in Example 1 with a #5 Meyer rod.

The film was air dried and then imagewise ablated onto a porous paper receptor sheet using a Datrax 765 YAG laser writer operating at 6.5 watts of laser power and 1200 line/inch resolution. The resultant film had a Dmin=0.11 (18A filter)/Dmax=3.30 (18A filter).

EXAMPLE 10

A mask was prepared by coating 5 g of a 7% solids Acheson graphite dispersion diluted with 5 g of a solvent mixture consisting of 50% MEK, 20% MPK, 15% n-BuAc and 15% cyclohexanone onto the metallized face surface of 50% transmission aluminized polyester film as described in Example 1 with a #6 Meyer rod. The coated film was then imagewise ablated onto a porous paper receptor sheet using a Datrax 765 YAG laser writer operating at 7.5 watts with 1,200 line/inch resolution. The resultant mask had a Dmin=0.16 and a Dmax=3.50 (18A filter).

EXAMPLE 11

Another type of mask was prepared by coating the following formulation:
 (i) 2.70 grams Hiltamine Arctic White Sol. (T1413) (Mobay Chemical Corp.), an ultraviolet absorber;
 (ii) 6.00 grams topcoat lacquer (American Inks and Coatings Corp. product #93-483);
 (iii) 20.0 grams solvent (50% MEK, 20% MPK, 15% n-BuAc, 15% cyclohexanone); and
 (iv) 0.21 grams Cyasorb IR 165 (American Cyanamid),
onto the metallized face surface of a 50% transmission aluminized polyester film as described in Example 1 using a #5 Meyer rod.

After air drying, the coated film was imagewise ablated onto a porous paper receptor sheet using a Datrax YAG laser writer operating at 8 watts with 1,200 lines/inch resolution. The resultant mask had a Dmin=0.15 and a Dmax=3.40 (18A filter).

EXAMPLE 12

Another type of mask was prepared by coating an aqueous black opaquing ink, marketed by Perfex Corporation, over a 50% transmission aluminized polyester film as described in Example 1 with a #7 Meyer rod. The coated film was air dried and imagewise ablated onto a porous paper receptor sheet using a Datrax 765 YAG laser writer operating at 8.5 watts with 1,200 line/inch resolution. The resultant mask had a Dmin=0.12 and a Dmax=2.90 (18A filter).

EXAMPLE 13

Another type of mask was prepared by coating the following formulation:
 (i) 4.00 grams topcoat lacquer (American Inks and Coatings Corp. product #93-483);
 (ii) 2.10 grams Curcumin (Aldrich, CAS #458-37-7), an ultraviolet absorber;
 (iii) 0.20 grams Cyasorb IR 165 (American Cyanamid); and
 (iv) 15.0 grams solvent (50% MEK, 20% MPK, 15% n-BuAc, 15% cyclohexanone),
onto a 50% transmission aluminized polyester film as described in Example 1 with a #5 Meyer rod.

After air drying, the coated film was imagewise ablated onto a porous paper receptor sheet using a Datrax 765 YAG laser writer operating at 8 watts with 1,200 line/inch resolution. The resultant mask had a Dmin=0.12 and Dmax=3.05 (18A filter).

EXAMPLE 14

The following formulation:
 (i) 0.50 grams 2,5-bis(4-diethylaminophenyl)-1,3,4-oxadiazole (Aldrich Chemical Co.), which is a fluorescent dye;
 (ii) 0.05 grams Cyasorb IR 165 (American Cyanamid);
 (iii) 6.00 grams topcoat lacquer (American Inks and Coatings Corp. product #93-483); and
 (iv) 20.0 grams solvent (50% MEK, 20% MPK, 15% n-BuAc, 15% cyclohexanone), was coated onto a 50% transmission aluminized polyester film as described in Example 1 with a #2 Meyer rod and imagewise ablated onto an uncoated white bond paper using a Datrax 765 YAG laser writer operating at 7.5 watts with 1,200 line/inch resolution. The resultant image transferred onto the receptor sheet was barely visible in white light, but when viewed under ultraviolet light the image was highly visible. The imaged receptor sheet was not reproducible on a Minolta 7E7P5401 copier.

EXAMPLE 15

The following samples of sputter coated metal films were overcoated with the cyan formulation described in Example 1 using a #3 Meyer rod by hand drawdown. The actual thickness of the metal layer was unknown; accordingly, the films were characterized by their visible transmission densities (VTD) of the uncoated films. The films were imaged using a Nd:YAG laser at 1064 nm output delivering 0.10 $J/cm^2$, 0.16 $J/cm^2$ or 0.22 $J/cm^2$ in 104 nanoseconds using an uncoated newsprint receptor. The percentage of material transferred was calculated as in Example 4.

The results reported in the following Table V were obtained:

TABLE V

| Metal VTD | Paper Dmax at $J/cm^2$ | | | Imaged Film Dmin at 0.22 $J/cm^2$ |
|---|---|---|---|---|
| | 0.10 | 0.16 | 0.22 | |
| Aluminum (vacuum metallized) | | | | |
| 0.77 | 30% | 100% | 100% | 0.05 |
| 0.50 | 65% | 100% | 100% | 0.05 |
| 0.43 | 95% | 100% | 100% | 0.05 |
| 0.24 | 100% | 100% | 100% | 0.05 |
| 0.15 | 80% | 100% | 100% | 0.05 |
| 0.12 | 70% | 100% | 100% | 0.05 |
| 0.10 | 45% | 85% | 100% | 0.05 |
| 0.05 | 0% | 10% | 30% | 0.05 |
| Copper oxide (black) | | | | |
| 1.89 | 0% | 100% | 100% | 0.12 |
| 0.98 | 0% | 100% | 100% | 0.18 |
| 0.51 | 0% | 75% | 100% | 0.15 |
| Copper oxide (yellow) | | | | |
| 0.32 | 0% | 0% | 25% | 0.65 |
| 0.19 | 0% | 0% | 35% | 0.58 |
| Tin | | | | |
| 0.4 | 35% | 90% | 100% | 0.17 |
| 0.26 | 0% | 55% | 80% | 0.17 |
| 0.12 | 0% | 0% | 30% | 0.50 |
| Indium/tin | | | | |
| 0.3 | 0% | 65% | 100% | 0.13 |
| 0.19 | 0% | 0% | 35% | 0.35 |
| 0.14 | 0% | 0% | 30% | 0.44 |

In a separate experiment, the following dynamic release layers were compared at 0.16 $J/cm^2$:

|  | Paper<br>Dmax | Imaged<br>Film<br>Dmin |
| --- | --- | --- |
| Aluminum<br>(vacuum metallized)<br>0.30 | 100% | .05 |
| Nickel/Chromium<br>0.24 | 100% | .04 |
| Palladium<br>0.24 | 100% | .04 |

While this invention has been described in terms of various preferred embodiments, the skilled artisan will appreciate that various modifications, substitutions, omissions and changes may be made without departing from the spirit thereof. Accordingly, it is intended that the scope of the present invention be limited solely by the scope of the following claims, including equivalents thereof.

What is claimed is:

1. A method for transferring a contrasting pattern of intelligence from a composite ablation-transfer imaging medium to a receptor element in contiguous registration therewith, said composite ablation-transfer imaging medium comprising a support substrate (i), at least one intermediate dynamic release layer (ii) essentially coextensive therewith and a laser radiation-ablative carrier topcoat (iii) also essentially coextensive therewith, said laser radiation-ablative carrier topcoat (iii) including an imaging amount of a contrast imaging material contained therein and comprising at least one laser-ablative binder and at least one laser absorber/sensitizer, and said at least one dynamic release layer (ii) absorbing such laser radiation at a rate sufficient to effect the imagewise ablation mass transfer of at least said carrier topcoat (iii), which method comprises imagewise laser-irradiating said composite ablation-transfer imaging medium according to such pattern of intelligence with an intensity sufficient to effect the imagewise ablation mass transfer of the volume of the imagewise-exposed area of at least the laser radiation-ablative carrier topcoat (iii) of said imaging medium securedly onto said receptor element and whereby said transferred contrast imaging material delineates said pattern of intelligence thereon.

2. The method as defined by claim 1, said at least one laser absorber/sensitizer comprising at least one near infrared absorber/sensitizer.

3. The method as defined by claim 1, said at least one laser-ablative binder being decomposable by acid catalysis.

4. The method as defined by claim 3, said essentially coextensive carrier topcoat (iii) further comprising at least one hydrogen atom donor for promoting acid formation for said catalyzed decomposition.

5. The method as defined by claim 2, said support substrate (i) of said imaging medium being transparent to near infrared laser irradiation.

6. The method as defined by claim 2, said support substrate (i) of said imaging medium being opaque to near infrared laser irradiation.

7. The method as defined by claim 2, said at least one near infrared absorber/sensitizer comprising an aromatic amine radical cation.

8. The method as defined by claim 2, said at least one near infrared absorber/sensitizer comprising a cation radical and an anion of a strong acid.

9. The method as defined by claim 2, said at least one near infrared absorber/sensitizer being soluble in said at least one laser-ablative binder.

10. The method as defined by claim 1, said at least one laser absorber/sensitizer consisting essentially of at least one non-black body visible absorber/sensitizer.

11. The method as defined by claim 10, said at least one non-black body visible absorber/sensitizer comprising a cyanine or phthalocyanine dye, a metal dithiolene, a methylene blue salt, a di- or triarylmethane cation salt, a Wurster's blue salt or an onium salt.

12. The method as defined by claim 3, said at least one laser-ablative binder being adopted for acid catalyzed decomposition at a temperature of less than about 200° C. as measured under equilibrium conditions.

13. The method as defined by claim 3, said at least one laser-ablative binder being adopted for acid catalyzed decomposition at a temperature of less than about 100° C. as measured under equilibrium conditions.

14. The method as defined by claim 12, said at least one laser-ablative binder comprising a nitrocellulose, polycarbonate, polyurethane, polyester, polyorthoester or polyacetal.

15. The method as defined by claim 4, said at least one hydrogen atom donor comprising an alcohol, thiol, phenol, amine or hydrocarbon.

16. The method as defined by claim 1, said at least one laser absorber/sensitizer initiating acid formation upon photo-excitation thereof.

17. The method as defined by claim 1, said at least one laser absorber/sensitizer being substantially colorless in the visible spectral region.

18. The method as defined by claim 12, said at least one laser-ablative binder comprising a nitrocellulose.

19. The method as defined by claim 12, said at least one laser-ablative binder comprising a polycarbonate.

20. The method as defined by claim 12, said at least one laser-ablative binder comprising a polyurethane.

21. The method as defined by claim 12, said at least one laser-ablative binder comprising a polyester.

22. The method as defined by claim 1, said at least one laser absorber/sensitizer comprising a black body absorber/sensitizer.

23. The method as defined by claim 1, said at least one laser-ablative binder comprising a polycarbonate, polysulfone, styrene/acrylonitrile polymer, polystyrene, cellulosic ether or ester, polyacetal, polymethacrylate, polyvinylidene chloride, α-chloroacrylonitrile, maleic acid polymer, or copolymers and derivatives thereof.

24. A method for transferring a contrasting pattern of intelligence from a composite ablation-transfer imaging medium to a receptor element in contiguous registration therewith, said composite ablation-transfer imaging medium comprising a support substrate (i), at least one intermediate dynamic release layer (ii) essentially coextensive therewith and a laser radiation-ablative carrier topcoat (iii) also essentially coextensive therewith, said laser radiation-ablative carrier topcoat (iii) including an imaging amount of a contrast imaging material contained therein, and said at least one dynamic release layer (ii) comprising a metal, metal oxide or metal sulfide thin film and absorbing such laser radiation at a rate sufficient to effect the imagewise ablation mass transfer of at least said carrier topcoat (iii), which method comprises imagewise laser-irradiating said composite ablation-transfer imaging medium according to such pattern of intelligence with an intensity sufficient to effect the imagewise ablation mass transfer of the volume of the imagewise-exposed area of at least the laser radiation-ablative carrier topcoat (iii) of said imaging medium securedly onto said receptor element and whereby said transferred contrast imaging material delineates aid pattern of intelligence thereon.

25. The method as defined by claim 24, such thin film changing physical state upon imagewise exposure to said laser radiation.

26. The method as defined by claim 24, said at least one dynamic release layer (ii) comprising a metal of Groups Ib, IIb, IIIa, IVa, IVb, Va, Vb, VIa, VIb, VIIb or VIII of the Periodic Table.

27. The method as defined by claim 26, said at least one dynamic release layer (ii) comprising an alloy of such metals.

28. The method as defined by claim 26, said at least one dynamic release layer (ii) comprising an alloy of such metals with an element of Groups Ia, IIa or IIIb of the Periodic Table.

29. The method as defined by claim 26, said at least one dynamic release layer (ii) comprising Al, Bi, Sn, In or Zn.

30. The method as defined by claim 29, said at least one dynamic release layer (ii) comprising an alloy of such metals.

31. The method as defined by claim 24, said at least one dynamic release layer (ii) comprising a metal oxide or sulfide of Al, Bi, Sn, In, Zn, Ti, Cr, Mo, W, Co, Ir, Ni, Pd, Pt, Cu, Ag, Au, Zr or Te.

32. The method as defined by claim 24, said support substrate (i) comprising a polyester film, and said at least one dynamic release layer (ii) comprising a thin metal film.

33. The method as defined by claim 32, said essentially coextensive carrier topcoat (iii) of said imaging medium comprising at least one laser-ablative binder.

34. The method as defined by claim 33, said essentially coextensive carrier topcoat (iii) of said imaging medium comprising at least one laser absorber/sensitizer.

35. A method for transferring a contrasting pattern of intelligence from a composite ablation-transfer imaging medium to a receptor element in contiguous registration therewith, said composite ablation-transfer imaging medium comprising a support substrate (i), at least one intermediate dynamic release layer (ii) essentially coextensive therewith and a laser radiation-ablation carrier topcoat (iii) also essentially coextensive therewith, said laser radiation-ablative carrier topcoat (iii) including an imaging amount of a contrast imaging material contained therein, and said at least one dynamic release layer (ii) comprising a low melting thin metal film and absorbing such laser radiation at a rate sufficient to effect the imagewise ablation mass transfer of at least said carrier topcoat (iii), which method comprises imagewise laser-irradiating said composite ablation-transfer imaging medium according to such pattern of intelligence with an intensity sufficient to effect the imagewise ablation mass transfer of the volume of the imagewise-exposed area of at least the laser radiation-ablative carrier topcoat (iii) of said imaging medium securedly onto said receptor element and whereby said transferred contrast imaging material delineates said pattern of intelligence thereon.

36. A method for transferring a contrasting pattern of intelligence from a composite ablation-transfer imaging medium to a receptor element in contiguous registration therewith, said composite ablation-transfer imaging medium comprising a support substrate (i), at least one intermediate dynamic release layer (ii) essentially coextensive therewith and a laser radiation-ablative carrier topcoat (iii) also essentially coextensive therewith, said laser radiation-ablative carrier topcoat (iii) including an imaging amount of a contrast imaging material contained therein, and said at least one dynamic release layer (ii) comprising Ge or a sensitized liquid crystal material and absorbing such laser radiation at a rate sufficient to effect the imagewise ablation mass transfer of at least said carrier topcoat (iii), which method comprises imagewise laser-irradiating said composite ablation-transfer imaging medium according to such pattern of intelligence with an intensity sufficient to effect the imagewise ablation mass transfer of the volume of the imagewise-exposed area of at least the laser radiation-ablative carrier topcoat (iii) of said imaging medium securedly onto said receptor element and whereby said transferred contrast imaging material delineates said pattern of intelligence thereon.

37. A method for transferring a contrasting pattern of intelligence from a composite ablation-transfer imaging medium to a receptor element in contiguous registration therewith, said composite ablation-transfer imaging medium comprising a support substrate (i), at least one intermediate dynamic release layer (ii) essentially coextensive therewith and a laser radiation-ablative carrier topcoat (iii) also essentially coextensive therewith, said laser radiation-ablative carrier topcoat (iii) including an imaging amount of a contrast imaging material and at least one laser-ablative binder contained therein and further including at least one laser absorber/sensitizer in an amount sufficient to effect the rapid partial decomposition of said at least one laser-ablative binder, and said at least one dynamic release layer (ii) absorbing such laser radiation at a rate sufficient to effect the imagewise ablation mass transfer of at least said carrier topcoat (iii), which method comprises imagewise laser-irradiating said composite ablation-transfer imaging medium according to such pattern of intelligence with an intensity sufficient to effect the imagewise ablation mass transfer of the volume of the imagewise exposed area of at least the laser radiation-ablative carrier topcoat (iii) of said imaging medium securedly onto said receptor element and whereby said transferred contrast imaging material delineates said pattern of intelligence thereon.

38. The method as defined by claim 37, carried out successively employing a common receptor element but a plurality of composite ablation-transfer imaging media, the respective ablative carrier topcoats of which including different contrast imaging colorants, and comprising transferring a multi-color proof to said common receptor element.

39. A method for transferring a contrasting pattern of intelligence from a composite ablation-transfer imaging medium to a receptor element in contiguous registration therewith, said composite ablation-transfer imaging medium comprising a support substrate (i), at least one intermediate dynamic release layer (ii) essentially coextensive therewith and a laser radiation-ablative carrier topcoat (iii) also essentially coextensive therewith, said laser radiation-ablative carrier topcoat (iii) including an imaging amount of a non-ablation sensitizing contrast imaging material contained therein which comprises a yellow, magenta or cyan dye or pigment, and said at least one dynamic release layer (ii) absorbing such laser radiation at a rate sufficient to effect the imagewise ablation mass transfer of at least said carrier topcoat (iii), which method comprises imagewise laser-irradiating said composite ablation-transfer imaging medium according to such pattern of intelligence with an intensity sufficient to effect the imagewise ablation mass transfer of the volume of the imagewise-exposed area of at least the laser radiation-ablative carrier topcoat (iii) of said imaging medium securedly onto said receptor element and whereby said transferred contrast imaging material delineates aid pattern of intelligence thereon.

40. A method for transferring a contrasting pattern of intelligence from a composite ablation-transfer imaging medium to a receptor element in contiguous registration therewith, said composite ablation-transfer imaging medium comprising a support substrate (i), at least one intermediate dynamic release layer (ii) essentially coextensive therewith and a laser radiation-ablative carrier topcoat (iii) also essentially coextensive therewith, said laser radiation-ablative carrier topcoat (iii) including an imaging amount of a non-ablation sensitizing contrast imaging material contained therein that is at least highly absorbing in the spectral region of 350 nm to 450 nm and which comprises curcumin, an azo derivative, an oxadiazole derivative, a decinnamalacetone derivative or a benzophenone derivative, and said at least one dynamic release layer (ii) absorbing such laser radiation at a rate sufficient to effect the imagewise ablation mass transfer of at least said carrier topcoat (iii), which method comprises imagewise laser-irradiating said composite ablation-transfer imaging medium according to such pattern of intelligence with an intensity sufficient to effect the imagewise ablation mass transfer of the volume of the imagewise-exposed area of at least the laser radiation-ablative carrier topcoat (iii) of said imaging medium securedly onto said receptor element and whereby said transferred contrast imaging material delineates said pattern of intelligence thereon.

41. A method for transferring a contrasting pattern of intelligence from a composite ablation-transfer imaging medium to a receptor element in contiguous registration therewith, said composite ablation-transfer imaging medium comprising a support substrate (i), at least one intermediate dynamic release layer (ii) essentially coextensive therewith and a laser radiation-ablative carrier topcoat (iii) also essentially coextensive therewith, said laser radiation-ablative carrier topcoat (iii) including an imaging amount of a non-ablation contrast imaging material contained therein which comprises a fluorescent oxazole, oxadiazole, coumarin or carbostyryl derivative, and said at least one dynamic release layer (ii) absorbing such laser radiation at a rate sufficient to effect the imagewise ablation mass transfer of at least said carrier topcoat (iii), which method comprises imagewise laser-irradiating said composite ablation-transfer imaging medium according to such pattern of intelligence with an intensity sufficient to effect the imagewise ablation mass transfer of the volume of the imagewise-exposed area of at least the laser radiation-ablative carrier topcoat (iii) of said imaging medium securedly onto said receptor element and whereby said transferred contrast imaging material delineates said pattern of intelligence thereon.

42. A method for transferring a contrasting pattern of intelligence from a composite ablation-transfer imaging medium to a receptor element in contiguous registration therewith, said composite ablation-transfer imaging medium comprising a support substrate (i), at least one intermediate dynamic release layer (ii) essentially coextensive therewith and a laser radiation-ablative carrier topcoat (iii) also essentially coextensive therewith, said laser radiation-ablative carrier topcoat (iii) including an imaging amount of a non-ablation sensitizing contrast imaging material contained therein which comprises magnetic particles, and said at least one dynamic release layer (ii) absorbing such laser radiation at a rate sufficient to effect the imagewise ablation mass transfer of at least said carrier topcoat (iii), which method comprises imagewise laser-irradiating said composite ablation-transfer imaging medium according to such pattern of intelligence with an intensity sufficient to effect the imagewise ablation mass transfer of the volume of the imagewise-exposed area of at least the laser radiation-ablative carrier topcoat (iii) of said imaging medium securedly onto said receptor element and whereby said transferred contrast imaging material delineates said pattern of intelligence thereon.

43. A method for transferring a contrasting magnetic pattern of intelligence from a composite ablation-transfer imaging medium to a receptor element in contiguous registration therewith, said composite ablation-transfer imaging medium comprising a support substrate (i), at least one intermediate dynamic release layer (ii) essentially coextensive therewith and a laser radiation-ablative carrier topcoat (iii) also essentially coextensive therewith, said laser radiation-ablative carrier topcoat (iii) including an imaging amount of a contrast imaging material contained therein which comprises a magnetic material, and said at least one dynamic release layer (ii) absorbing such laser radiation at a rate sufficient to effect the imagewise ablation mass transfer of at least said carrier topcoat (iii), which method comprises imagewise laser-irradiating said composite ablation-transfer imaging medium according to such magnetic pattern of intelligence with an intensity sufficient to effect the imagewise ablation mass transfer of the volume of the imagewise-exposed area of at least the laser radiation-ablative carrier topcoat (iii) of said imaging medium securedly onto said receptor element and whereby said transferred contrast imaging magnetic material delineates said pattern of intelligence thereon.

44. A method for transferring a contrasting fluorescent pattern of intelligence from a composite ablation-transfer imaging medium to a receptor element in contiguous registration therewith, said composite ablation-transfer imaging medium comprising a support substrate (i), at least one intermediate dynamic release layer (ii) essentially coextensive therewith and a laser radiation-ablative carrier topcoat (iii) also essentially coextensive therewith, said laser radiation-ablative carrier topcoat (iii) including an imaging amount of a contrast imaging material contained therein which comprises a fluorescent material, and said at least one dynamic release layer (ii) absorbing such laser radiation at a rate sufficient to effect the imagewise ablation mass transfer of at least said carrier topcoat (iii), which method comprises imagewise laser-irradiating said composite ablation-transfer imaging medium according to such fluorescent pattern of intelligence with an intensity sufficient to effect the imagewise ablation mass transfer of the volume of the imagewise-exposed area of at least the laser radiation-ablative carrier topcoat (iii) of said imaging medium securedly onto said receptor element and whereby said transferred contrast imaging fluorescent material delineates and pattern of intelligence thereon.

45. A method for transferring a contrasting electrically conducting pattern of intelligence from a composite ablation-transfer imaging medium to a receptor element in contiguous registration therewith, said composite ablation-transfer imaging medium comprising a support substrate (i), at least one intermediate dynamic release layer (ii) essentially coextensive therewith and a laser radiation-ablative carrier topcoat (iii) also essentially coextensive therewith, said laser radiation-ablative carrier topcoat (iii) including an imaging amount of a contrast imaging material contained therein which comprises an electrically conducting material, and said at least one dynamic release layer (ii) absorbing such laser radiation at a rate sufficient to effect the imagewise ablation mass transfer of at least said carrier topcoat (iii), which method comprises imagewise laser-irradiating said composite ablation-transfer imaging medium according to such electrically conducting pattern of intelligence with an intensity sufficient to effect the imagewise ablation mass transfer of the volume of the imagewise-exposed area of at least the laser radiation-ablative carrier topcoat (iii) of said imaging medium securedly onto said receptor element and whereby said transferred contrast imaging electrically conducting material delineates said pattern of intelligence thereon.

* * * * *